(12) United States Patent
Ling et al.

(10) Patent No.: US 7,689,949 B1
(45) Date of Patent: Mar. 30, 2010

(54) EVALUATING GREEN'S FUNCTIONS FOR MODELING MULTILAYER INTEGRATED CIRCUITS

(75) Inventors: Feng Ling, Gilbert, AZ (US); Ben Song, San Jose, CA (US); Vladimir I. Okhmatovski, St. Vincent, MN (US); Enis Aykut Dengi, Tempe, AZ (US)

(73) Assignee: Cadence Design Systems, Inc., San Jose, CA (US)

( * ) Notice: Subject to any disclaimer, the term of this patent is extended or adjusted under 35 U.S.C. 154(b) by 376 days.

(21) Appl. No.: 11/725,015

(22) Filed: Mar. 16, 2007

(51) Int. Cl.
*G06F 17/50* (2006.01)
*G06G 7/56* (2006.01)

(52) U.S. Cl. .................... 716/4; 716/1; 716/5; 716/15; 716/16; 703/5; 703/13

(58) Field of Classification Search ................ 716/1, 716/4, 5, 15, 16; 703/5, 13; 367/37, 135; 342/196
See application file for complete search history.

(56) References Cited

U.S. PATENT DOCUMENTS

| | | | | |
|---|---|---|---|---|
| 6,051,027 | A * | 4/2000 | Kapur et al. ................... | 703/5 |
| 7,003,745 | B2 * | 2/2006 | Subasic et al. ................. | 716/4 |
| 7,110,323 | B2 * | 9/2006 | Marmalyevskyy et al. .... | 367/37 |
| 7,127,688 | B2 | 10/2006 | Ling et al. | |
| 7,145,330 | B2 * | 12/2006 | Xiao .......................... | 324/244 |
| 7,421,178 | B2 * | 9/2008 | Podolskiy et al. ........... | 385/129 |
| 7,509,245 | B2 * | 3/2009 | Siebrits et al. ................ | 703/10 |
| 2009/0228847 | A1 * | 9/2009 | Suaya ........................... | 716/4 |

OTHER PUBLICATIONS

Khalil et al.; "Efficient method-of-moments formulation for the modeling of planar conductive layers in a shielded guided-wave structure"; Sep. 1999; Microwave Theory and Techniques, IEEE Transactions on; vol. 47, Issue 9, Part 1, pp. 1730-1736.*

Yuan et al.; "A direct discrete complex image method from the closed-form Green's functions in multilayered media"; Mar. 2006; Microwave Theory and Techniques, IEEE Transactions on; vol. 54, Issue 3, pp. 1025-1032.*

Liu et al. ("Application of DCIM to MPIE-MoM analysis of 3D PEC objects in multilayered media"; Feb. 2002; Antennas and Propagation, IEEE Transactions on; vol. 50, Issue 2, pp. 157-162.*

Ling et al.; "An efficient algorithm for analyzing large-scale microstrip structures using adaptive integral method combined with discrete complex-image method"; May 2000; Microwave Theory and Techniques, IEEE Transactions on; vol. 48, Issue 5, pp. 832-839.*

(Continued)

*Primary Examiner*—Helen Rossoshek
(74) *Attorney, Agent, or Firm*—Duane Morris LLP

(57) ABSTRACT

A method of modeling an integrated circuit includes: specifying a layout for the integrated circuit, wherein the layout includes a plurality of devices arranged in a plurality of layers and a plurality of connections between the layers; specifying locations for a source point and an observation point for the integrated circuit; determining a plurality of static images for the source point and the observation point; determining a plurality of discrete complex images for the source point and the observation point; determining a Green's-function value for the source point and the observation point by combining the static images and the discrete complex images; and saving at least some values based on the Green's-function value.

29 Claims, 12 Drawing Sheets

OTHER PUBLICATIONS

Weeks, W. (1970). "Calculation of Coefficients of Capacitance of Multiconductor Transmission Lines in the Presence of a Dielectric Interface," IEEE Transactions on Microwave Theory and Techniques, MTT-18(1):35-43.

Hua, Y. et al. (1989). "Generalized Pencil-of-Function Method for Extracting Poles of an EM System from Its Transient Response," IEEE Transactions on Antennas and Propagation, 37(2):229-234.

Michalski, K. et al. (1990). "Electromagnetic Scattering and Radiation by Surfaces of Arbitrary Shape in Layered Media, Part I: Theory," IEEE Transactions on Antennas and Propagation, 28(3):335-344.

Chow, Y.L. et al. (1991). "A Closed-Form Spatial Green's Function for the Thick Microstrip Substrate," IEEE Transactions on Microwave Theory and Techniques, 39(3):588-592.

Aksun, M.I. (1996). "A Robust Approach for the Derivation of Closed-Form Green's Functions," IEEE Transactions on Microwave Theory and Techniques, 44(5):651-658.

Zhao, J. et al. (1998). "Efficient Three-Dimensional Extraction Based on Static and Full-Wave Layered Green's Functions," 35th Design Automation Conference, AMC, 6 pages.

Michalski, K. et al. (1997). "Multilayered Media Green's Functions in Integral Equation Formulations," IEEE Transactions on Antennas and Propagation, 45(3):508-519.

Zhao, J. et al. (1997). "Green function via moment matching for rapid and accurate substrate parasitics evaluation," IEEE 1997 Custom Integrated Circuits Conference, pp. 371-374.

Cai, W. et al. (2000). "Fast Calculations of Dyadic Green's Functions for Electromagnetic Scattering in a Multilayered Medium," Journal of Computational Physics, 165: 1-21.

Ling, F. et al. (2000). "Discrete Complex Image Method for Green's Functions of General Multilayer Media," IEEE Microwave and Guided Wave Letters, 10(10):400-402.

Ling, F. et al. (2005). "Large-Scale Broad-Band Parasitic Extraction for Fast Layout Verification of 3-D RF and Mixed-Signal On-Chip Structures," IEEE Transactions on Microwave Theory and Techniques, 53(1):264-273.

Simsek, E. et al. (2006). "Singularity Subtraction for Evaluation of Green's Functions for Multilayer Media," IEEE Transactions on Microwave Theory and Techniques, 54(1):216-225.

* cited by examiner

Algorithm 1 Image Tracing: Find $A^P_{s,n}$ and $a_n$ in (A13), (A16)

1: $Inc.m \leftarrow V_g^P(z'+,z')$ {magnitude of wave traveling up}
2: $Inc.d \leftarrow 0$ {distance wave going up has traveled}
3: $Inc.i \leftarrow i_{src}$ {interface up-going wave originated from}
4: $Inc.dir \leftarrow 1$ {direction of wave traveling up is $+1$}
5: $Q.push(Inc)$ {push into queue wave traveling up}
6: $Inc.m \leftarrow \pm V_g^P(z'-,z')$ {$\pm$ depends on $s$, see (A10)}
7: $Inc.dir \leftarrow -1$ {direction of wave traveling down is $-1$}
8: $Q.push(Inc)$ {push into queue wave traveling down}
9: $n \leftarrow 0$ {initialize image counter}
10: if $i_{src} = i_{obs}$ then
11:   $n \leftarrow n+1$ {1st image is primary field, if $i_{src} = i_{obs}$}
12:   $A^P_{s,n} \leftarrow V_g^P(z'+,z')$; $\quad \Delta_n \leftarrow 0$
13: end if
14: while $\Delta T_0 > TOL$ do
15:   $Inc \leftarrow Q.top()$;$\quad Q.pop()$ {get wave with max key}
16:   if $Inc.dir = 1$ then
17:     $i \leftarrow Inc.i+1$ {index of interface inc. wave hits}
18:     $Ref.m \leftarrow Inc.m \cdot R^P_{i+1,i}$; $\quad Tr.m \leftarrow Inc.m \cdot T^P_{i+1,i}$
19:   else if $Inc.dir = -1$ then
20:     $i \leftarrow Inc.i-1$ {index of interface inc. wave hits}
21:     $Ref.m \leftarrow Inc.m \cdot R^P_{i-1,i}$; $\quad Tr.m \leftarrow Inc.m \cdot T^P_{i-1,i}$
22:   end if
23:   $Ref.i \leftarrow i$ {interface ref wave originated from}
24:   $Ref.dir \leftarrow -Inc.dir$ {ref wave changes direction}
25:   $Ref.d \leftarrow Inc.d + d_i$; $\quad Tr.d \leftarrow Inc.d + d_i$
26:   $Tr.i \leftarrow i$; $\quad Tr.dir \leftarrow Inc.dir$
27:   $Q.push(Ref)$; $\quad Q.push(Tr)$
28:   if $i = i_{obs}$ then
29:     $n \leftarrow n+1$; $\quad A^P_{s,n} \leftarrow Tr.m$; $\quad a_n \leftarrow Tr.d$
30:   end if
31: end while

FIG. 12

EVALUATING GREEN'S FUNCTIONS FOR MODELING MULTILAYER INTEGRATED CIRCUITS

BACKGROUND OF THE INVENTION

1. Field of Invention

The present invention relates to integrated circuits and more particularly to modeling integrated circuits with multiple layers.

2. Description of Related Art

The full-wave electromagnetic solver has become an essential part in the design flow for radio frequency integrated circuits (RFICs) serving as both a design and a verification tool. A three-dimensional broadband full-wave solver based on the integral equation (IE) method with the pre-corrected Fast Fourier Transform (FFT) acceleration has been developed to fulfill these functions [1].

The multilayer Green's function evaluation is essential to the performance of an IE solver. Various approaches have been developed to accelerate the efficient computation of multilayer Green's functions, such as the discrete complex image method (DCIM) [2], the fast Hankel transform (FHT) [3], and the window function based method [4]. The DCIM has been widely employed and improved since its debut. Two-level DCIM [5] was developed to split the original path into two. By sampling the paths at different rates, the method improved the efficiency and accuracy comparing the original one-level algorithm. Generalized surface wave pole extraction was developed to extend the DCIM to general multilayer media [6].

For on-chip applications, the semiconductor process must first be examined. The vertical cross-section of the metallization layers of a typical four-metal-layer semiconductor process is shown in FIG. 2. In order to fill the IE matrix entries efficiently, a 3D Green's function database is deployed [1]. The database is populated with the value of the Green's function between several source points at z' and observation points at z for various horizontal distances ρ. Even with the aid of such a database, the rapid evaluation of the Green's function for each matrix entry is critical. Note that the distance between the adjacent layers is only a few microns or less, which causes the spectral kernel of Green's functions to decay slowly. Consequently, number of sampling points has to be increased to accurately capture the whole spectrum, which will slow down the DCIM dramatically because the generalized pencil of function (GPOF) method [9] in the DCIM has computation time proportional to $O(N_s^3)$, $N_s$ is the number of sampling points. For that reason, accelerating convergence of the spectral kernel is necessary before applying the GPOF.

Thus, there is a need for improved methods for evaluating Green's functions for modeling multilayer integrated circuits.

SUMMARY OF THE INVENTION

In one embodiment of the present invention, a method of modeling an integrated circuit includes: specifying a layout for the integrated circuit, wherein the layout includes a plurality of devices arranged in a plurality of layers and a plurality of connections between the layers; specifying locations for a source point and an observation point for the integrated circuit; determining a plurality of static images for the source point and the observation point; determining a plurality of discrete complex images for the source point and the observation point; determining a Green's-function value for the source point and the observation point by combining the static images and the discrete complex images; and saving at least some values based on the Green's-function value.

According to one aspect of this embodiment, specifying the layout may include specifying geometrical and electromagnetic parameters for at least some of the devices. According to another aspect, the devices may be embedded in dielectric material included in the layers and may include interconnects for making electrical connections between devices. According to another aspect, the connections between the layers may include vias for making electrical connections between the layers. According to another aspect, the devices may include interconnects for making electrical connections between devices, the source point may correspond to one of the interconnects, and the observation point may correspond to another of the interconnects.

According to another aspect, the source point may correspond to a circuit input, the observation point may correspond to a circuit output, and the circuit input and the circuit output may each include a voltage value or a current value from a transmission line model for the integrated circuit. According to another aspect, determining the static images may include determining magnitudes and distances for the static images in correspondence to the source point and the observation point. According to another aspect, determining the static images may include tracing a plurality of waves between the source point and the observation point, and at least some waves may determine magnitudes and distances for the static images.

According to another aspect, determining the discrete complex images may include: determining a truncation value for integrating a shifted Green's function that corresponds to a subtraction of the static images from the Green's function, and sampling the shifted Green's function based on the truncation value to determine values for the discrete complex images. Additionally, determining the values for the discrete complex images may include: representing the shifted Green's function as a generalized pencil of functions to determine coefficients and exponents for the discrete complex images.

According to another aspect, determining the Green's-function value may include: adding a contribution from the shifted Green's function to a contribution from the static images. According to another aspect, saving at least some values based on the Green's-function value may include storing the Green's-function value in a matrix that includes related Green's function values for relating voltage values and current values in the integrated circuit.

Additional embodiments relate to an apparatus for carrying out any one of the above-described methods, where the apparatus may include a computer for executing instructions related to the method. For example, the computer may include a processor with memory for executing at least some of the instructions. Additionally or alternatively the computer may include circuitry or other specialized hardware for executing at least some of the instructions. Additional embodiments also relate to a computer-readable medium that stores (e.g., tangibly embodies) a computer program for carrying out any one of the above-described methods with a computer.

In these ways the present invention enables improved methods for evaluating Green's functions for modeling multilayer integrated circuits.

BRIEF DESCRIPTION OF THE DRAWINGS

FIG. 12 shows pseudo-code for related to the embodiment shown in FIG. 11.

DETAILED DESCRIPTION OF EXEMPLARY EMBODIMENTS

1. Modeling Multilayer Integrated Circuits

Figure 1:
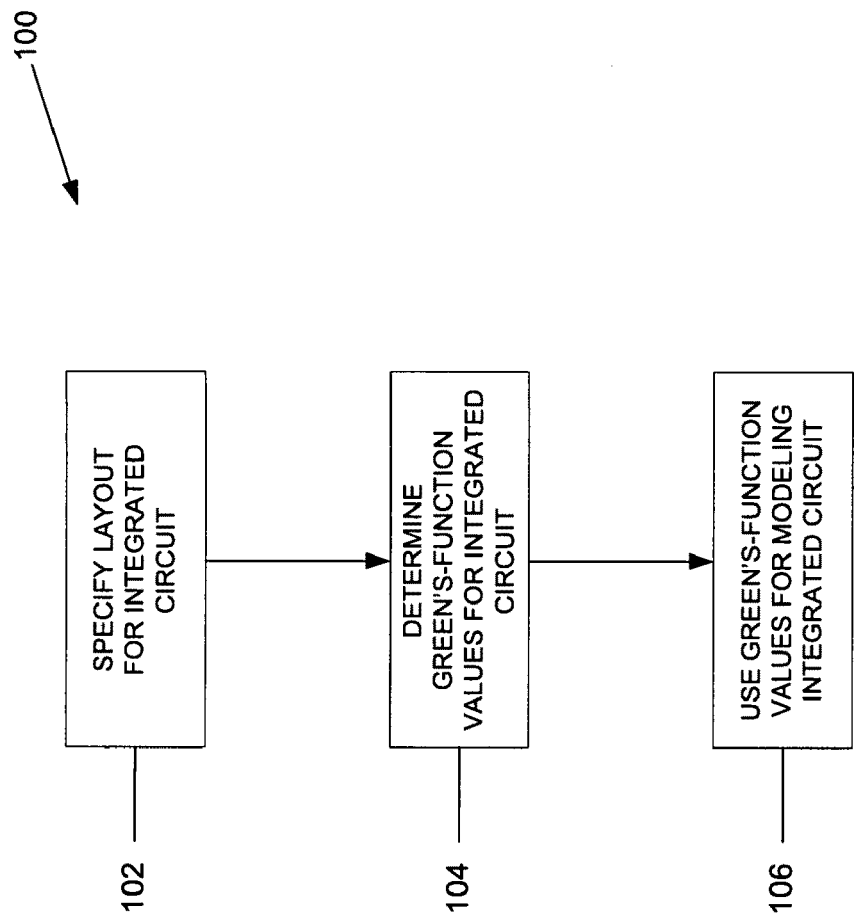
FIG. 1 shows an exemplary method of modeling an integrated

As shown in FIG. 1, an exemplary method of modeling an integrated circuit 100 includes specifying a layout for the integrated circuit 102, determining Green's function values for the integrated circuit 104, and using the Green's function values for modeling the integrated circuit 106.

Figure 2:
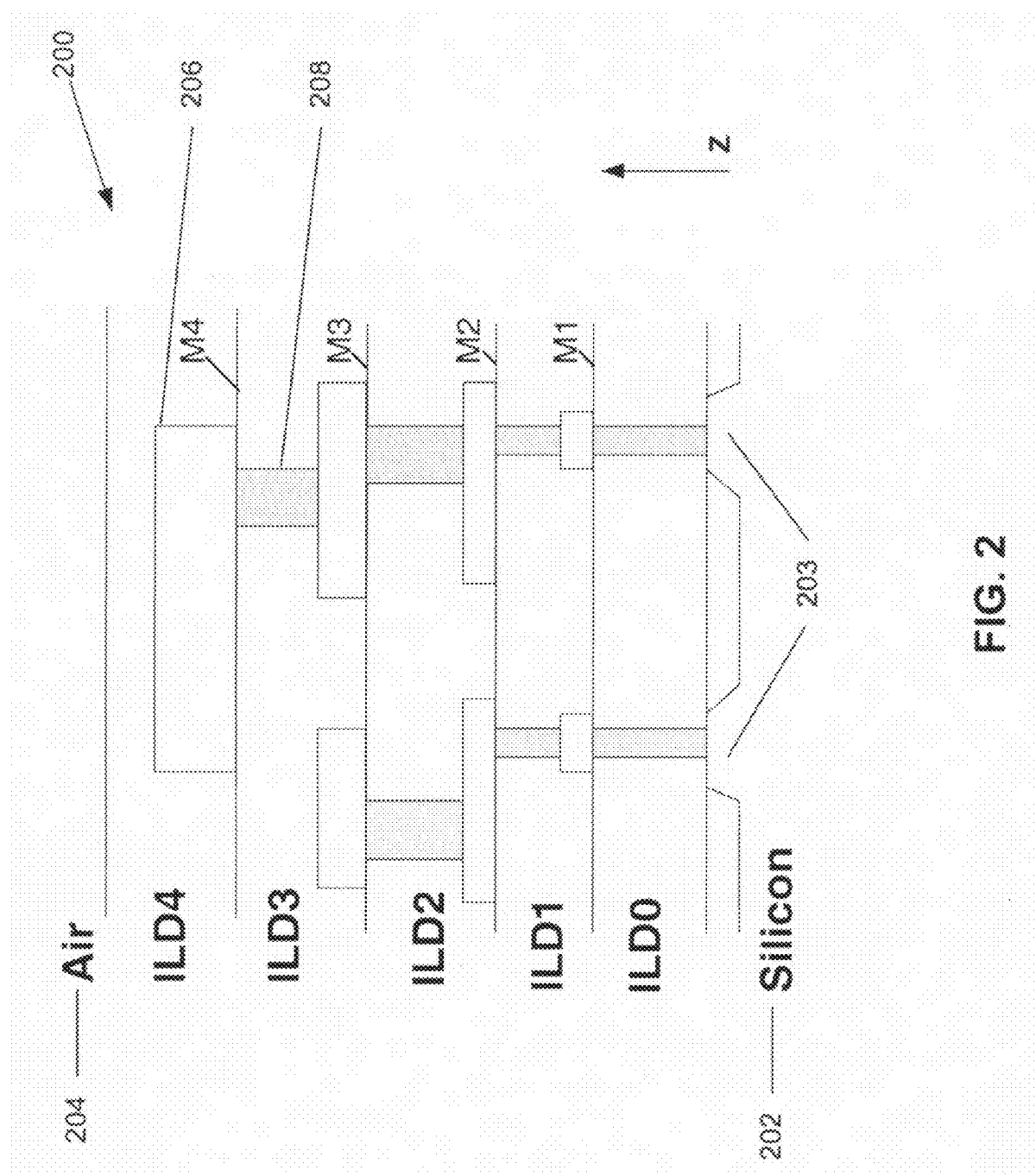
FIG. 2 shows an exemplary integrated circuit (IC) in cross-section.

FIG. 2 shows an exemplary integrated circuit (IC) in cross-section 200. Between the silicon base 202, where transistor wells 203 are shown, and the air 204, a number of dielectric layers (or interlayers) are placed: ILD0, IDL1, IDL2, IDL3, IDL4. Metal layers M1, M2, M3, M4 are embedded in the dielectric layers and include devices 206 (e.g., as shown by the exaggerated rectangles in the figure). Typically the devices 206 are electrically connected to other devices within a layer and across layers by interconnects, including the vias 208 shown between the metal layers in the figure. The dimensions of the IC 200 are not drawn to scale. Typically, the horizontal dimension (e.g., size of IC) is about 1,000 microns. The vertical dimension of the silicon base is about 500 microns. The vertical dimensions of the dielectric layers (ILD0-ILD4) are each about 1-4 microns. The vertical dimensions of the metal layers range from about 3-4 microns at the top (M4) to about 0.1 microns at the bottom (M1). Typical operating frequencies range from DC (direct current or 0 Hz) to 10 GHz. Note that these dimensions and operating ranges are typical but other values (e.g., smaller dimensions) are also within the scope of the invention.

A conventional approach to modeling the electromagnetic properties of this IC 200, the Method of Moments solver requires efficient calculation of Green's functions. Green's function for multilayer media is in form of Sommerfeld Integral (SI), which is time-consuming to evaluate using direct numerical integration:

$$G(\rho, z, z') = S_n(\tilde{G}(k_\rho, z, z')) = \frac{1}{2\pi}\int_0^\infty \tilde{G}(k_\rho, z, z')J_n(k_\rho\rho)k_\rho^{n+1}\,dk_\rho. \quad (1)$$

With reference to the IC 200 in FIG. 2, ρ takes values in the horizontal dimension, z' is the vertical coordinate of the source point, and z is the vertical coordinate of the observation point.

One approach to accelerate the calculation of SIs is the Discrete Complex Image Method (DCIM) In the conventional Discrete Complex Image Method (DCIM) [2], a Generalized Pencil of Functions (GPOF) [9] is employed to approximate the spectral kernel as a summation of exponentials:

$$F(k_\rho) = \sum_{i=1}^{N} a_i e^{-b_i k_z}. \quad (2)$$

Then the spatial domain Green's function can be found via the Sommerfeld identity $$G(\rho, z, z') = \frac{1}{4\pi}\sum_{i=1}^{N} a_i \frac{e^{-jkr_i}}{r_i}, r_i = \sqrt{\rho^2 - b_i^2}. \quad (3)$$

To achieve the GPOF approximation in equation (1), the original DCIM uniformly samples the function $F(k_\rho)$ along the path defined as $$k_z = k\left[-jt + \left(1 - \frac{t}{T_0}\right)\right], \quad 0 \le t \le T_0. \quad (4)$$

Figure 3:
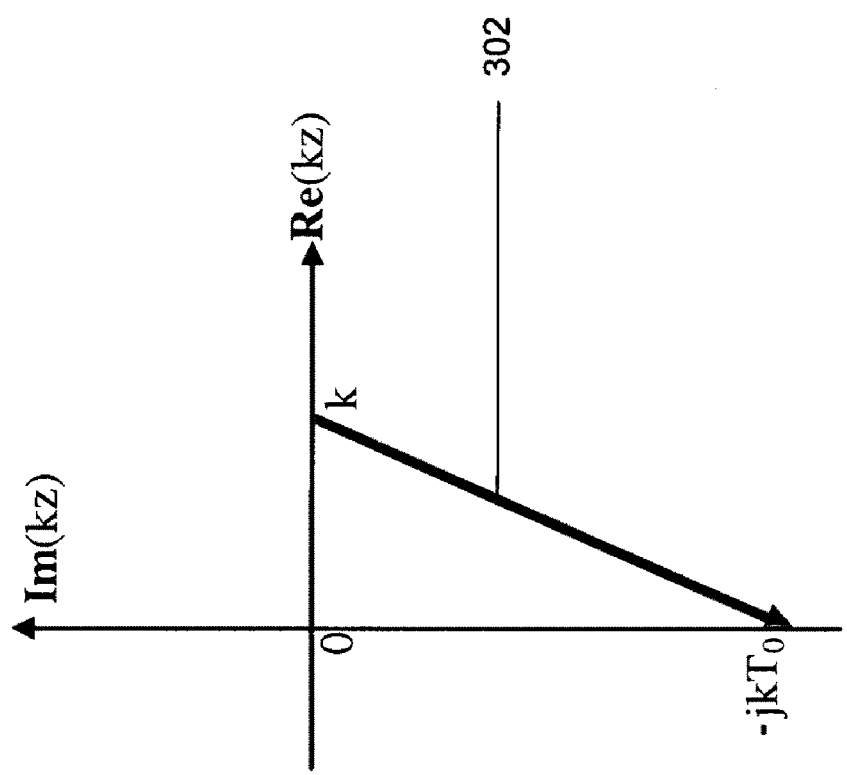
FIG. 3 shows an exemplary integration path for the Green's function related to the IC shown in FIG. 2.

FIG. 3 shows an integration path 302 for the Green's function (or spectral kernel) from k to $-jkT_0$ in the complex plane. The spectral kernel is uniformly sampled along the path, and the truncation variable $T_0$ is chosen so the spectral kernel is negligible. That is, the truncation point $T_0$ is determined by assuming the spectral kernel $F(k_\rho)$ converges at. $k_\rho = \sqrt{1+T_o^2}k$. Because of the uniform sampling, the number of sampling points $N_s$ could be large if the function decays slowly. Notably, the GPOF procedure has $O(N_s^3)$ complexity, which is computationally expensive to perform. For on-chip applications, the spectral kernel does decay slowly because $e^{-jk_2 h}$ changes slowly with small layer thickness h in microns.

Figure 4:
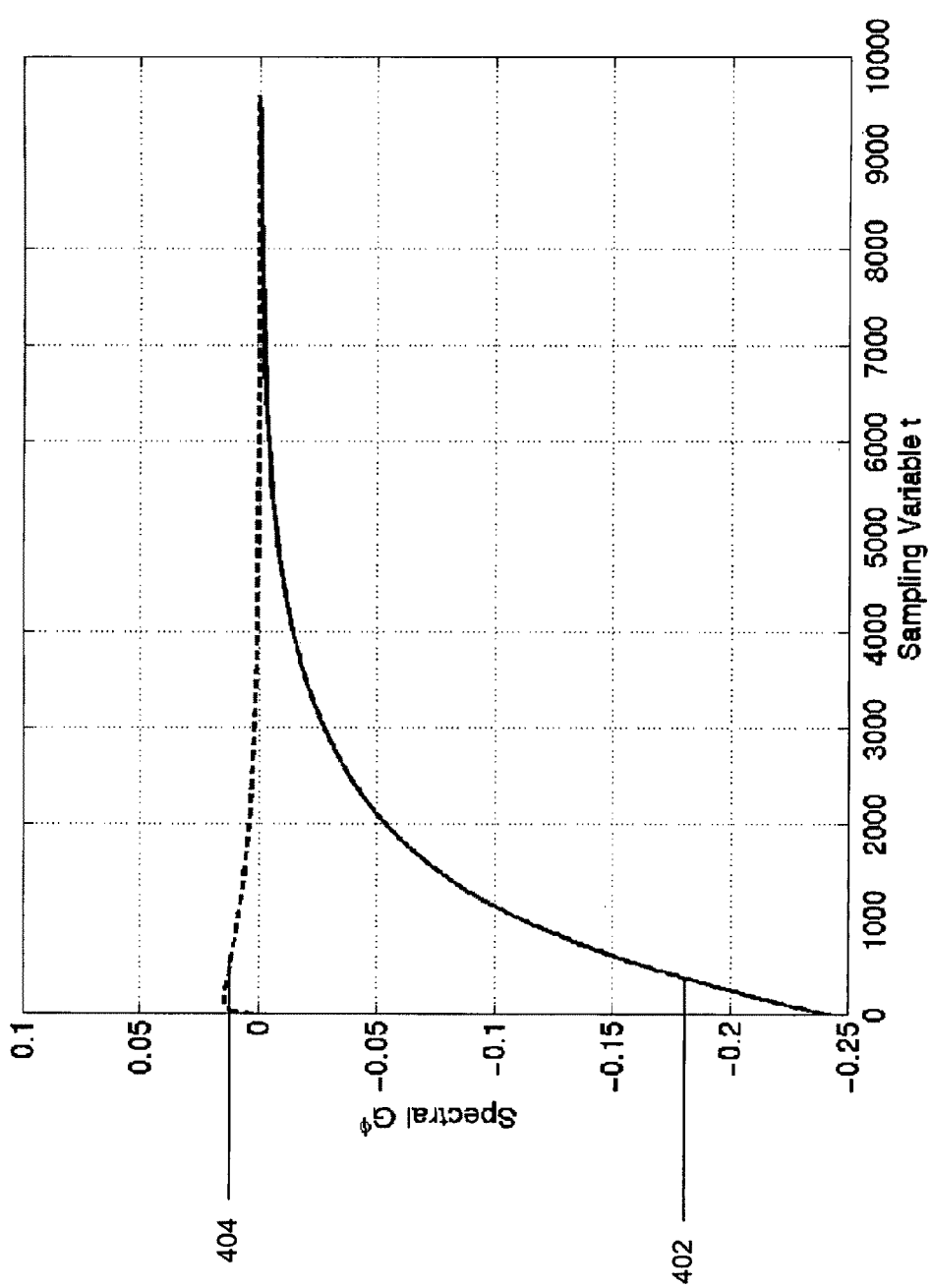
FIG. 4 shows the decay of the Green's function along the integration path shown in FIG. 3 for a conventional approximation.
Figure 5:
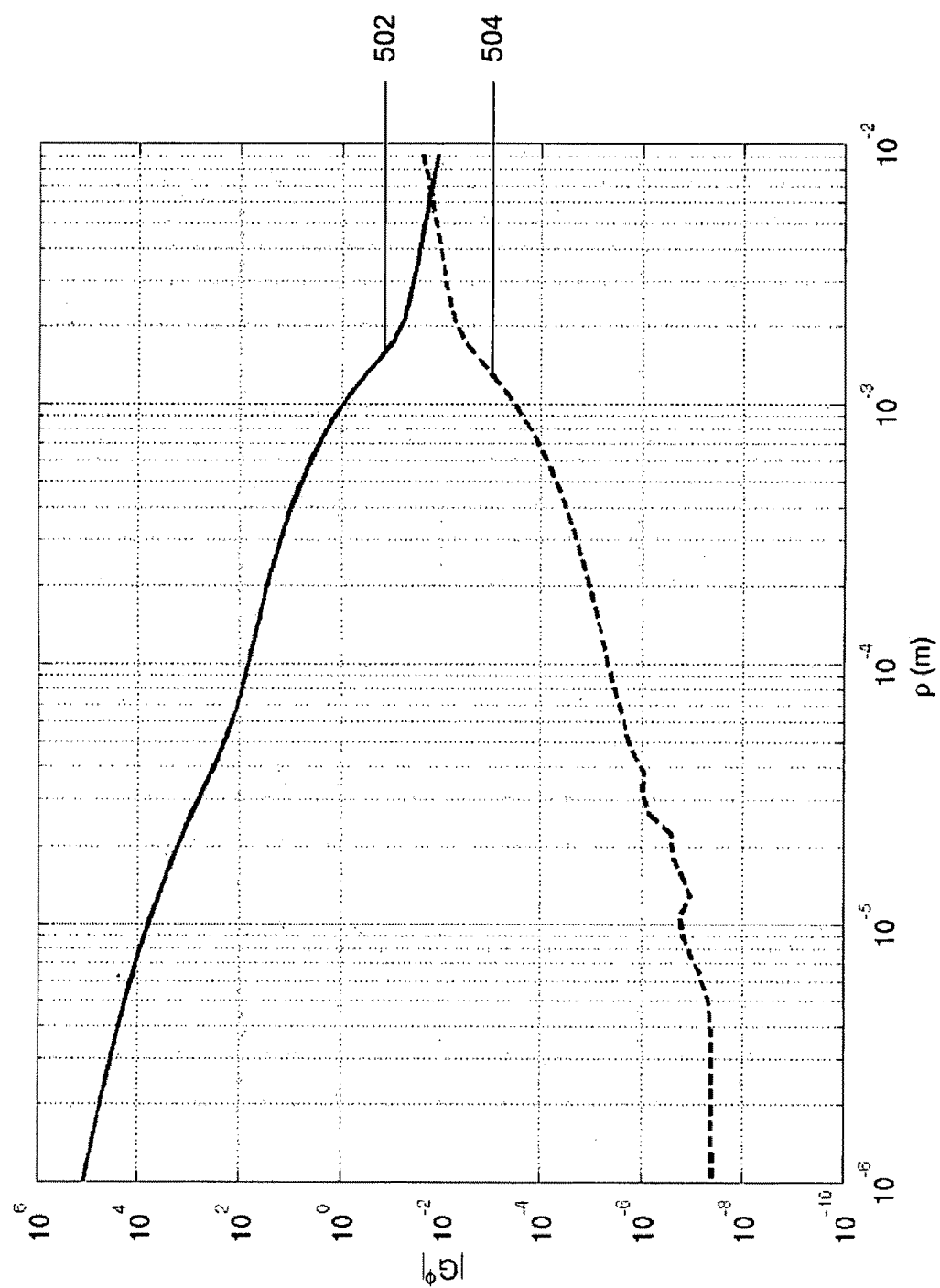
FIG. 5 shows the magnitude and error of the Green's function approximation related to the example shown in FIG. 4 for a conventional approximation.

FIGS. 4-5 show an example that illustrates the conventional convergence properties related to resolving the Green's function for approximating the integral. FIG. 4 shows the decay of the Green's function along the integration path 302 in FIG. 3 including the real part 402 and the imaginary part 404. In this case, the convergence tolerance value was set at 1.0 e−5 so that the truncation variable becomes $T_0$=9600 and $N_{sample}$=500 points are needed to resolve the integral along this path.

FIG. 5 shows the magnitude 502 of the Green's function for the case where the observation point z and source point z' are both equal to about 508 microns (e.g., in the second or third layer about 8 microns above the silicon, which has a vertical thickness of about 500 microns). The horizontal distance variable p is shown on the horizontal axis. Also shown is the relative error 504 compared with direct numerical integration to high accuracy. As shown in the figure, the relative error increases for larger distances because the sampling points are insufficient to accurately capture the near spectrum. However, increasing sampling points hurts the efficiency of the DCIM.

2. Combining Static Images and Discrete Complex Images

Figure 6:
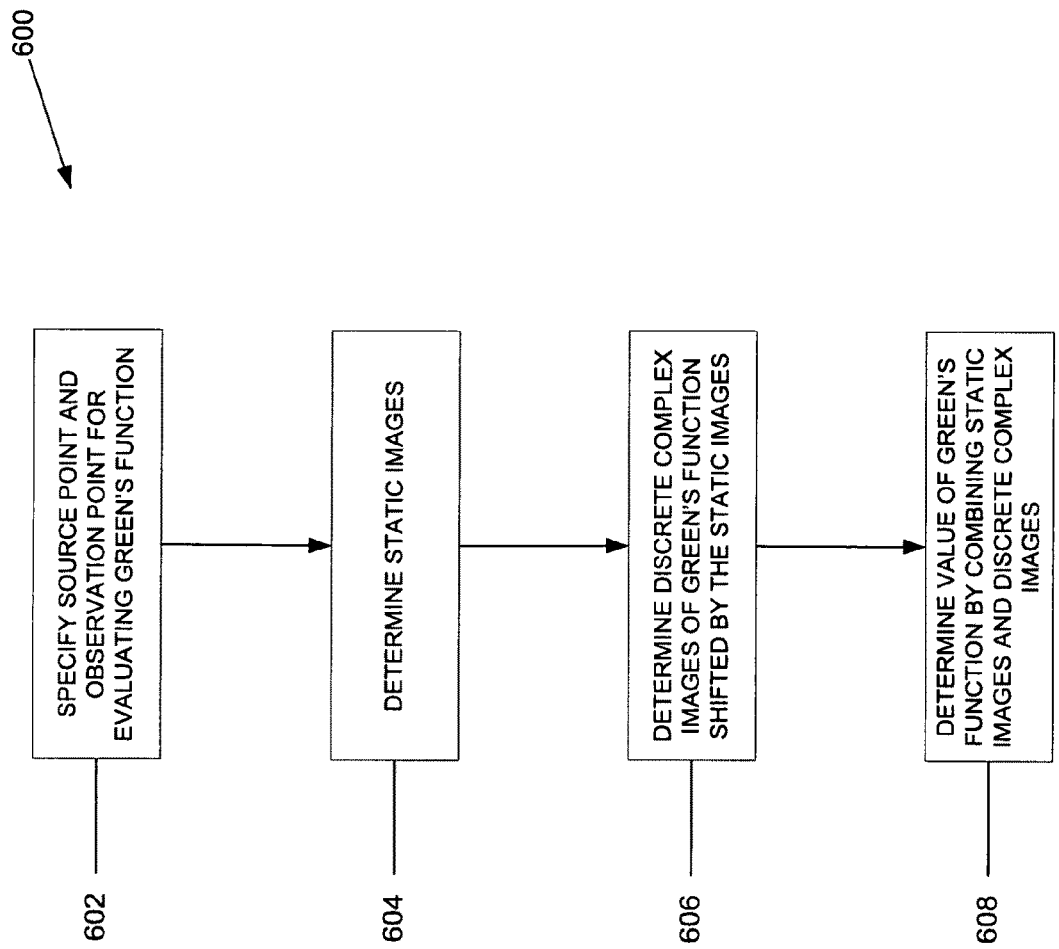
FIG. 6 shows exemplary method for evaluating a Green's function related to the IC shown in FIG. 3 according to an embodiment of the present invention.

FIG. 6 shows a method 600 for evaluating the Green's function according to the present invention (e.g., for the second step 104 in FIG. 1). The method includes specifying a source point and an observation point for evaluating the Green's function 602, determining static images 604, determining discrete complex images of the Green's function shifted by the static images 606, and determining a Green's-function value by combining the static images and discrete complex images.

As discussed above, one or more pairs of source points and observation points are typically determined 602 (e.g., to provide entries in a database). Determining static images (e.g., quasi-dynamic images) 604 enables improved methods for evaluating the Green's function by subtracting off components that slow the convergence of the corresponding approximations. As discussed below in further detail, a generalized image method [3] is utilized to efficiently extract the images with the largest contributions.

As a specific example, consider the Green's function for scalar potential as an example [7]; the other terms of the full-wave Green's function can be derived similarly. As frequency goes to zero, the spectral Green's function becomes $$\tilde{G}^{\phi}(k_\rho) = \frac{j\omega}{k_\rho^2}(V_i^e - V_i^h) \xrightarrow{\omega=0} \frac{1}{jk_z} \sum_{i=0}^{N_{si}} m_i^e e^{-jk_z d_i}, \quad (5)$$

where $N_{si}$ is the number of static images and $m_i$ and $d_i$ are the magnitude and distance for the ith image, respectively. Superscript e in $m_i^e$ stands for electrostatic-type images. The images are efficiently extracted by using a priority queue to trace the waves. First, an incident wave is split into a reflected wave and a transmitted wave, which are both inserted into the queue according to their priority. If the wave hits the observation point, it is collected as an image. Then the top element in the priority queue is popped up. And then the splitting and inserting procedures are repeated until the maximum number of images (e.g., a threshold value) has been reached.

Figure 7:
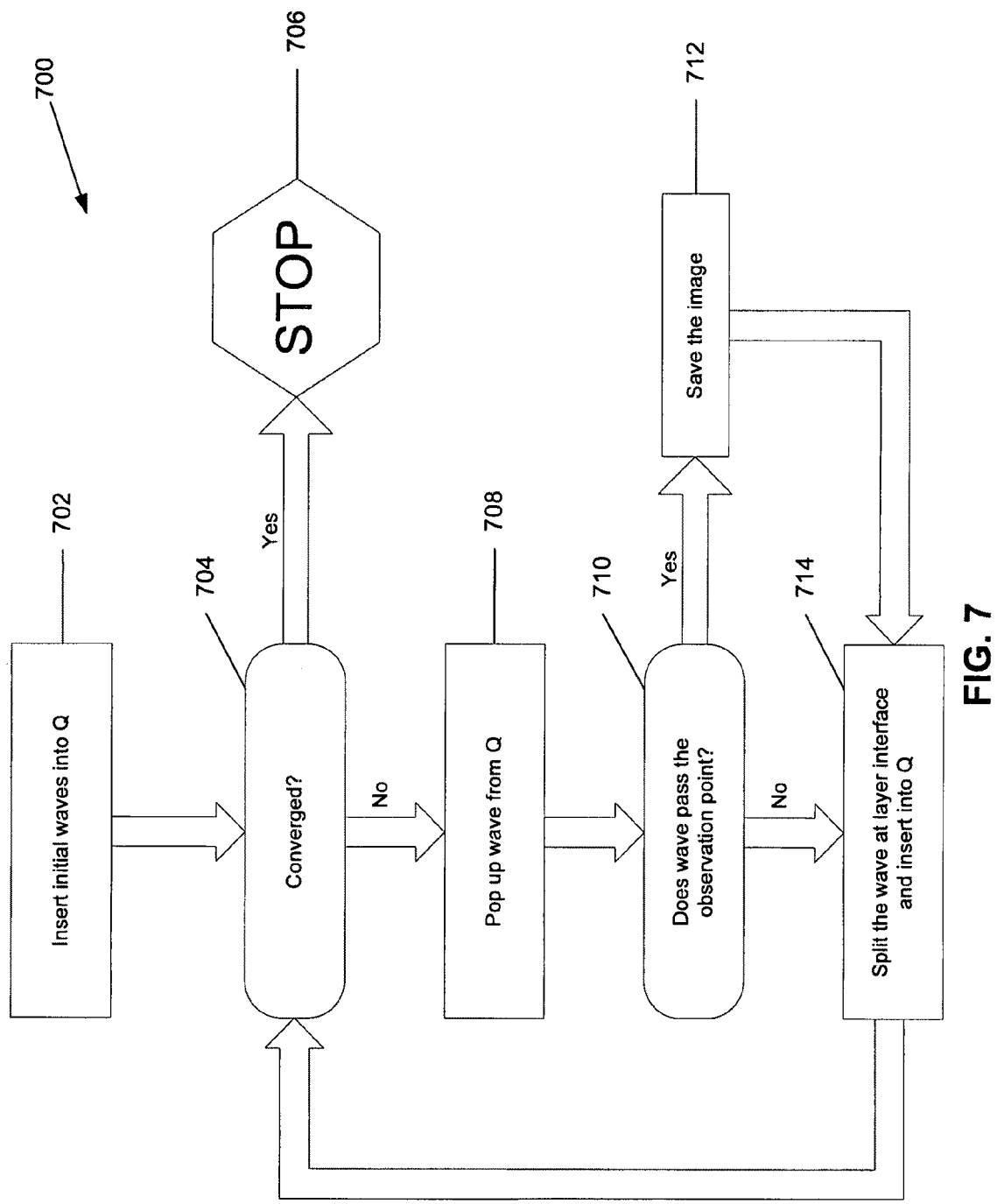
FIG. 7 shows an exemplary flow chart for a method of finding static images using a queue according to an embodiment of the present invention.

FIG. 7 shows a flow chart for an exemplary method 700 for finding the static images using a queue labeled as Q in the figure. First initial waves are inserted into the queue 702. When the convergence test 704 is passed (e.g., approximation not changing to within some relative tolerance), the procedure ends 706. At each cycle of the loop a wave is popped up from the queue 708 (e.g., removed for processing). If the wave from the queue passes the observation point 702, the corresponding image is saved. Next the wave is split at the next layer interface and the split component waves are inserted into the queue 714 and the process is continued 704.

Figure 8:
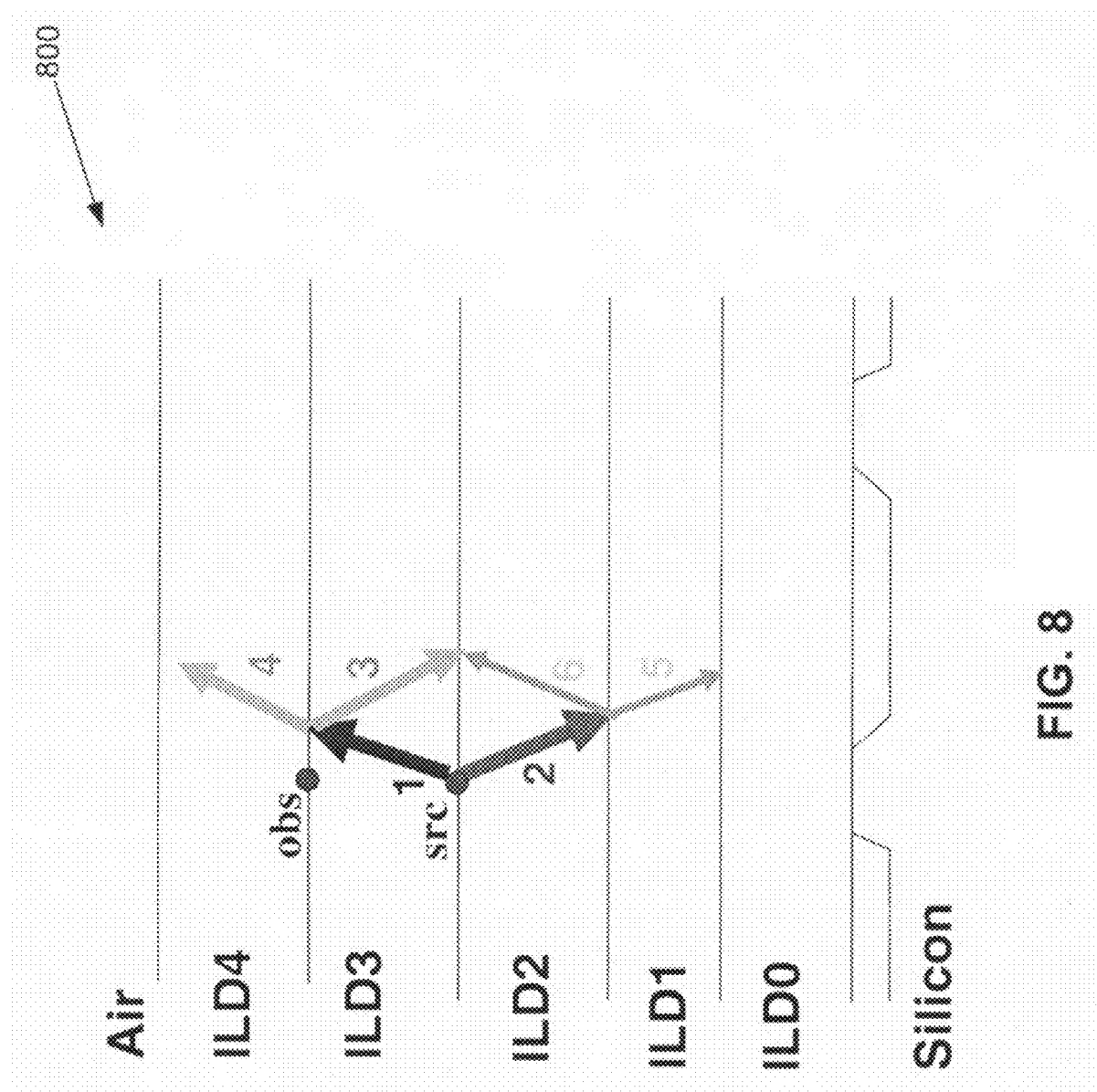
FIG. 8 shows a sequence of waves corresponding to the flow chart shown in FIG. 7.

FIG. 8 shows a sequence of waves 800 that have been propagated according to this method 700 for the reference IC 200. In FIG. 8, a source point ("src") and an observation point ("obs") are shown and waves are followed in accordance with the flow outlined in FIG. 7. Note that waves are modeled as one-dimensional in the vertical direction, and the two dimensional characterization is for illustrative purposes.

In FIG. 8, waves numbered 1 and 2 begin at the source point. Wave 1 is split into waves 3 and 4, and wave 2 is reflected to wave 5, etc. The waves passing the observation point (i.e., waves 4 and 9) contribute to the results at the observation point. For instance, if a total of $N_{image}$ images having been found, each image with its magnitude and $m_i$ distance $d_i$ $$IMG(m_i, d_i), i=1,2 \ldots N_{image}. \quad (6)$$

After the static images have been determined 604, the discrete complex images are determined 606 for the Green's function shifted by the static images. The new spectral kernel is $$\tilde{G}_{new} = \tilde{G} - \tilde{G}_{image} \quad (7)$$

$$= \tilde{G} - \sum_{i=1}^{N_{image}} m_i e^{-jk_z d_i}.$$

Now the spectral integration along the path 302 can be carried out for a smaller value of $T_0$ because of the better conditioning of the shifted Green's function $\tilde{G}_{new}$. This gives the discrete complex images $$\tilde{G}_{new} = \sum_{i=1}^{N_{ci}} a_i e^{-jk_z b_i}. \quad (8)$$

Figure 9:
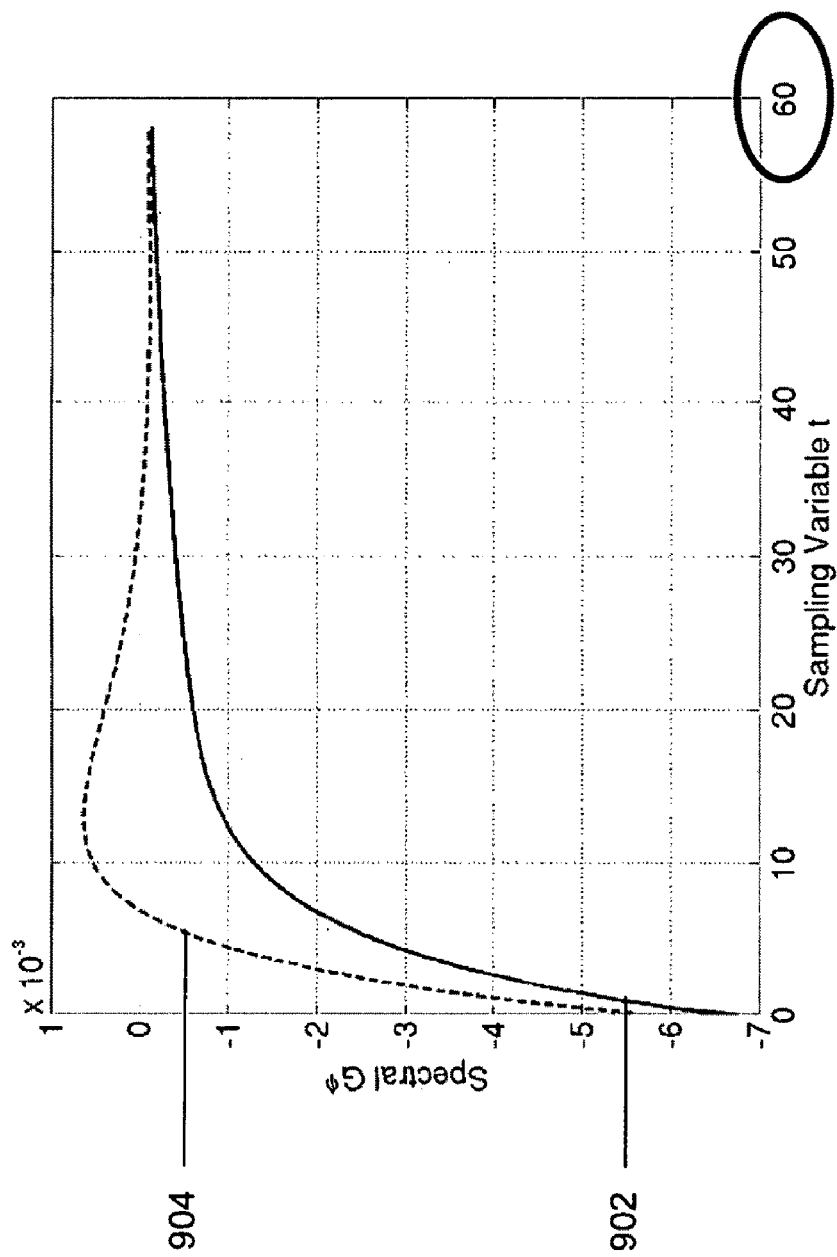
FIG. 9 shows the decay of the Green's function along the integration path shown in FIG. 3 according to an embodiment of the present invention.
Figure 10:
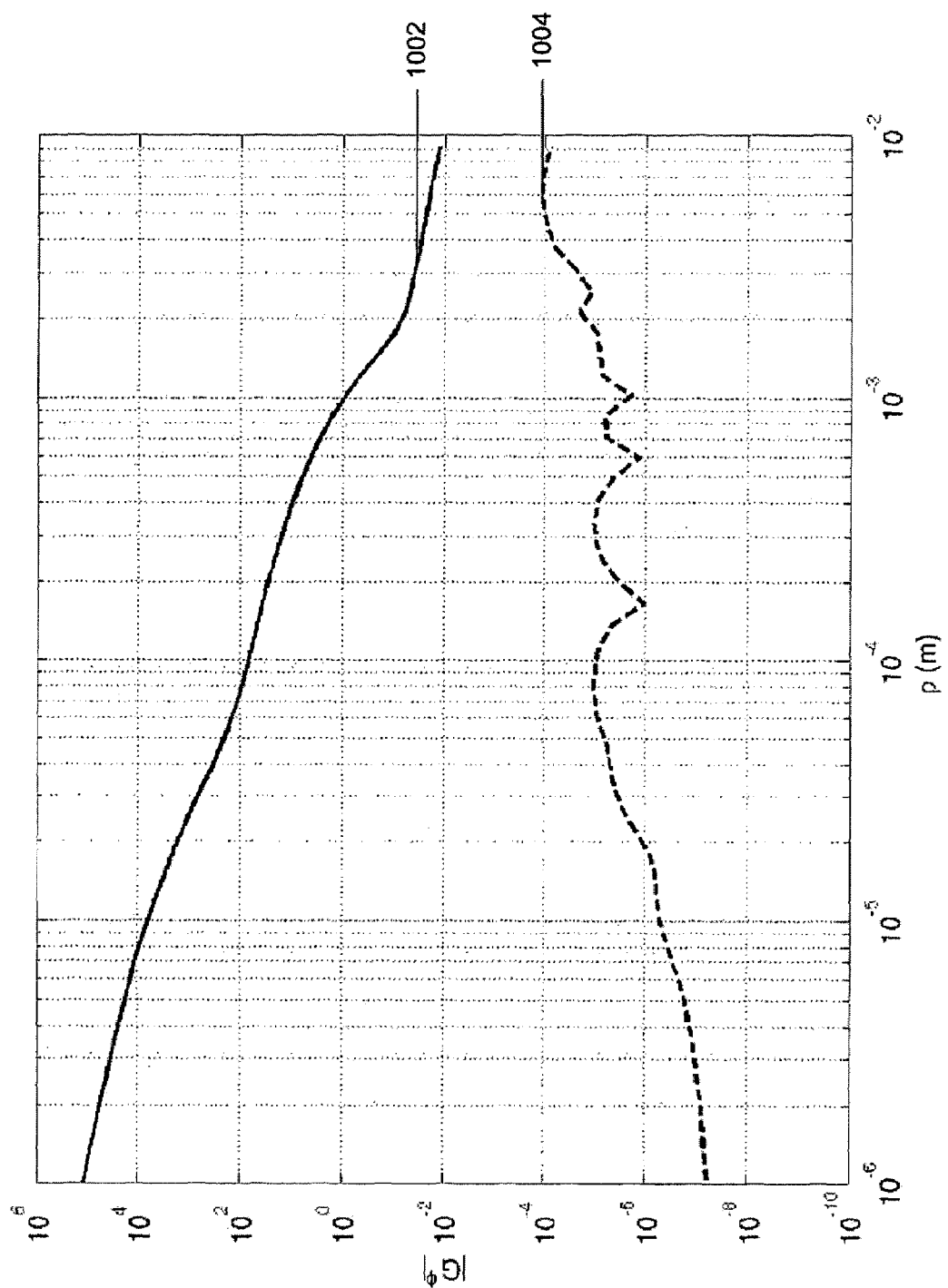
FIG. 10 shows the magnitude and error of the Green's function approximation related to the example shown in FIG. 9 according to an embodiment of the present invention.

FIGS. 9-10 show curves corresponding to FIGS. 4-5. FIG. 9 shows the decay of the Green's function $\tilde{G}_{new}$ along the integration path 302 in FIG. 3 including the real part 902 and the imaginary part 904. In this case with the convergence tolerance value again set at 1.0 e−5, the truncation variable becomes $T_0=58$ and $N_{sample}=100$ points are needed to resolve the integral along this path. FIG. 10 shows the magnitude 1002 of the Green's function for the case where the observation point z and source point z' are both equal to about 500 microns. The horizontal distance variable p is shown on the horizontal axis. Also shown is the relative error 1004 compared with numerical integration to high accuracy. As illustrated by FIG. 9, The convergence is greatly improved, that is, the truncation point $T_0$ is reduced from 9600 to 58. And, as illustrated by FIG. 10, the accuracy is improved by three orders of magnitude in the far field compared to the original DCIM (i.e., FIG. 5).

Next the values of the original Green's function $\tilde{G}$ can be determined 608 by combining static images (e.g., FIG. 8) and discrete complex images (e.g., FIG. 3). This gives the Green's function as $$\tilde{G} = \sum_{i=1}^{N_{image}} m_i \frac{e^{-jk\sqrt{\rho^2+d_i^2}}}{\sqrt{\rho^2+d_i^2}} + \sum_{i=1}^{N_{ci}} a_i \frac{e^{-jk\sqrt{\rho^2+b_i^2}}}{\sqrt{\rho^2+b_i^2}}. \quad (9)$$

In this expression for the Green's function, the $N_{image}$ static images have values for magnitudes $m_i$ and distances $d_i$, and the $N_{ci}$ complex images have values for spectral coefficients $a_i$ and $b_i$. With reference to the IC 200 in FIG. 2, ρ is measured the horizontal dimension.

As illustrated by the above example, extracting the quasi-dynamic images from the spectral kernel greatly accelerates convergence of the spectral kernel. Therefore, with the same number of sampling points, the accuracy of the DCIM is improved, especially in the far field zone.

3. More Detailed Embodiments

Figure 11:
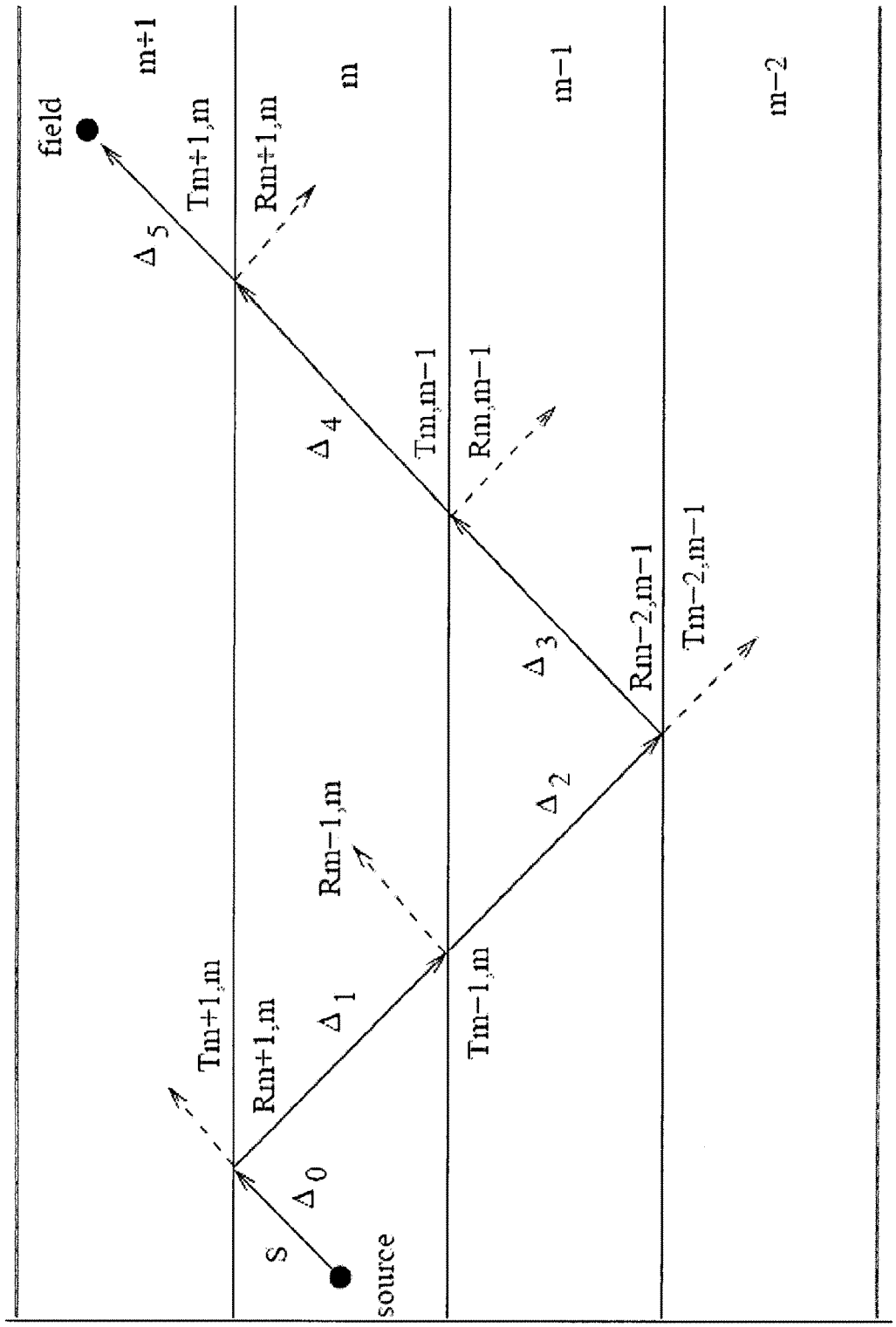
FIG. 11 shows an exemplary wave-tracing method for static image extraction in a multilayer integrated circuit according to an embodiment of the present invention.

FIGS. 11 and 12 illustrate more detailed embodiments related to the embodiments shown in FIGS. 7 and 8. FIG. 11 illustrates an exemplary wave-tracing method for static image extraction in a multilayer integrated circuit. In FIG. 11 the rays shown are strictly one-dimensional and a two-dimensional depiction is shown for ease of visualization. FIG. 12 shows corresponding pseudo-code for an exemplary image tracing method according to the present invention. Note that the formulas in (A14)-(A15) for $A_{s,n}^P$ and $a_n$ correspond respectively to magnitude $m_n$ and distance $d_n$ in (6) where s denotes the source and p denotes the polarization index.

3.1. Quasi-Static Images in the Green's Function

The electric field E in layered media due to electric current J is expressed via vector potential Green's function $\overline{G}^A$ as $$E = -j\omega\mu_0(\overline{I} + k^{-2}\nabla\nabla\cdot)\langle\overline{G}^A, J\rangle, \quad (A1)$$

where $\overline{G}^A$ is a dyadic written in the traditional form as [8]

$$\overline{G}^A = (\hat{x}\hat{x} + \hat{y}\hat{y})G_{xx}^A + \hat{z}\hat{x}G_{zx}^A + \hat{z}\hat{y}G_{zy}^A + \hat{z}\hat{z}G_{zz}^A. \quad (A2)$$

Alternatively, the electric field can be written using Michalski-Zhang's mixed-potential formulation C [8]

$$E = -j\omega\mu_0\langle \overline{K}^A, J\rangle + (j\omega\epsilon_0)^{-1}\nabla\langle G^\Phi, \nabla'\cdot J\rangle, \quad (A3)$$

$$\overline{K}^A = (\hat{x}\hat{x} + \hat{y}\hat{y})K_{xx}^A + \hat{z}\hat{x}K_{zx}^A + \hat{x}\hat{z}K_{xz}^A + \hat{z}\hat{y}K_{zy}^A + \hat{y}\hat{z}K_{yz}^A + \hat{z}\hat{z}K_{zz}^A. \quad (A4)$$

The spectra of the components in the dyadics $\overline{G}^A$ are expressed in terms of the TLGF currents and voltages [8]

$$\tilde{G}_{xx}^A = \frac{1}{j\omega\mu_0}V_i^h, \quad \tilde{G}_{zx}^A = \frac{\mu_r k_x}{jk_\rho^2}(I_i^h - I_i^e), \quad (A5)$$

$$\tilde{G}_{zy}^A = \frac{\mu_r k_y}{jk_\rho^2}(I_i^h - I_i^e), \quad \tilde{G}_{zz}^A = \frac{\mu_r}{j\omega\epsilon_0\epsilon_r'}I_v^e.$$

The same currents and voltages enter in the expressions for the spectra of the mixed-potential dyadic $\overline{K}^A$ $$\overline{K}_{xx}^A = \overline{G}_{xx}^A, \quad \overline{K}_{zx}^A = \overline{G}_{zx}^A, \quad \overline{K}_{zy}^A = \overline{G}_{zy}^A, \quad (A6)$$

$$\overline{K}_{xz}^A = \frac{\mu_r' k_x}{jk_\rho^2}(V_v^h - V_v^e), \quad \overline{K}_{yz}^A = \frac{\mu_r' k_y}{jk_\rho^2}(V_v^h - V_v^e),$$

$$\overline{K}_{zz}^A = \frac{1}{j\omega\epsilon_0}\left[\left(\frac{\mu_r}{\epsilon_r'} + \frac{\mu_r'}{\epsilon_r}\right)I_v^e\right] + \frac{k_0^2\mu_r\mu_r'}{k_\rho^2}(I_v^h - I_v^e),$$

and the scalar potential spectral Green's function $\tilde{G}^\Phi$ $$\tilde{G}^\Phi = \frac{j\omega\epsilon_0}{k_\rho^2}(V_i^e - V_v^h). \quad (A7)$$

The currents $I_s^P$ and voltages $V_s^P$ are the solutions of the transmission line equations for unit-strength impulsive current s=i and voltage s=v sources [7]

$$\frac{dV_i^P}{dz} = -jk_z Z^P I_i^P, \quad \frac{dI_i^P}{dz} = -jk_z Y^P V_i^P + \delta(z - z'); \quad (A8)$$

$$\frac{dV_v^P}{dz} = -jk_z Z^P I_v^P + \delta(z - z'), \quad \frac{dI_v^P}{dz} = -jk_z Y^P V_v^P.$$

In (A8) the polarization index p=e, h defines the characteristic impedances $Z^P$ and admittances $Y^P=1/Z^P$ as $$Z^e = \frac{k_z}{\omega\epsilon_0\epsilon_r}, \quad Z^h = \frac{\omega\mu_0\mu_r}{k_z}, \quad k_z = \sqrt{k_0^2\epsilon_r\mu_r - k_\rho^2}. \quad (A9)$$

The exact analytic solution of equations (A8) in a general TLGF can be obtained recursively [7]. Our primary interest at this point is in systematic extraction of the quasi-static solutions from (A8) for a general layered medium. This can be accomplished via prioritized tracing of the reflected and transmitted waves in the TLGF. The starting values for the waves are set to the magnitudes of the current and voltage waves, $Z^P/2$, $Y^P/2$, or $\pm\frac{1}{2}$, produced by the corresponding unit-strength-sources in an infinite homogeneous transmission line with the characteristic impedance of the source layer $$V_i^P = \frac{Z^P}{2}e^{-jk_z'|z-z'|}, \quad I_v^P = \frac{Y^P}{2}e^{-jk_z'|z-z'|}, \quad (A10)$$

$$I_i^P = \pm\frac{1}{2}e^{-jk_z'|z-z'|}, \quad V_v^P = \pm\frac{1}{2}e^{-jk_z'|z-z'|}.$$

The reflection and transmission coefficients for the waves at line discontinuities can be readily obtained from the continuity of the currents $I_s^P$ and voltages $V_s^P$ and the source-free transmission line equations (A8). For the current $I_s^P$ and voltage $V_s^P$ waves traveling from layer m towards layer m+1 the reflection coefficients $R_{I,m+1,m}^P$ and $R_{V,m+1,m}^P$ are $$R_{I,m+1,m}^P = -R_{V,m+1,m}^P = \frac{Z_m^P - Z_{m+1}^P}{Z_m^P + Z_{m+1}^P},$$

and transmission coefficients $T_{1,m+1,m}^P$ and $T_{V,m+1,m}^P$ are $$T_{V,m+1,m}^P = 1 + R_{V,m+1,m}^P, \quad T_{1,m+1,m}^P = 1 + R_{1,m+1,m}^P. \quad (A11)$$

The static limit for the above reflection coefficients is $$\hat{R}_{I,m+1,m}^e = \hat{R}_{V,m+1,m=}^e = \frac{\epsilon_{m+1} - \epsilon_m}{\epsilon_{m+1} + \epsilon_m}, \quad (A12)$$

$$\hat{R}_{I,m+1,m}^h = \hat{R}_{V,m+1,m=}^h = \frac{\mu_m - \mu_{m+1}}{\mu_m + \mu_{m+1}}.$$

The corresponding static limits of transmission coefficients are given by (A11) where the reflection coefficients are to be replaced with their static limits (A12).

The static limits (A12) for the reflection and transmission coefficients combined with the ray tracing procedure discussed in the following Section allow us to extract static contributions to the TLGF's currents $I_s^P$ and voltages $V_s^P$ in the form $$\hat{V}_s^P = \sum_{n=1}^{N_{V_s}^P} A_{s,n}^P e^{-jk_z'a_n}, \hat{I}_s^P = \sum_{n=1}^{N_{I_s}^P} B_{s,n}^P e^{-jk_z'b_n}. \quad (A13)$$

The magnitudes of static voltage and current images, $A_{s,n}^P$ and $B_{s,n}^P$, respectively, are computed as products of reflection and transmission coefficients (A12). To elaborate consider an example of the wave tracing depicted in FIG. 11. Assuming that a voltage wave defining an image $A_{s,n}^P e^{-jk_z a_n}$ is being traced, we obtain the magnitude and location of the image as $$A_{s,n}^P = V_s^P(z'+,z')\hat{R}_{V,m+1,m}^P \hat{T}_{V,m-1,m}^P \times \hat{R}_{V,m-2,m-1}^P$$
$$\hat{T}_{V,m,m-1}^P \hat{T}_{V,m+1,m}^P. \quad (A14)$$

$$a_n = \Delta_0 + \Delta_1 + \Delta_2 + \Delta_3 + \Delta_4 + \Delta_5. \quad (A15)$$

where $V_s^P(z'+,z')$ is the starting magnitude of the wave according to (A10) and FIG. 11, i.e. $V_s^P(z'+,z')=Z^P/2$ and $V_s^P(z'+,z')=\frac{1}{2}$. In case the initial wave travels from the source in the negative z direction, the starting magnitude is to be taken as $V_s^P(z'-,z')=Z^P/2$ and $V_s^P(z'-,z')=-\frac{1}{2}$.

Since the number of reflections and transmissions a wave launched from the source point experiences before it reaches the field point depends on the configuration of the layered media, we can write the image magnitude (A14) and location (A15) in a general form $$A_{s,n}^P = V_s^P(z'\pm,z')\pi\hat{R}_V^P \pi \hat{T}_V^P, a_n = \Sigma\Delta, \quad (A16)$$

where the products of reflection and transmission coefficients $\pi\hat{R}_V^P$ and $\pi\hat{T}_V^P$ as well as location of the image $\Sigma\Delta$ in (A16) are defined numerically as discussed in the following description of the image extraction algorithm.

3.2. Image Extraction Algorithm

The prioritized image extraction algorithm is based on systematic tracing of the elementary reflections and transmission of the waves at the impedance discontinuities in the TLGF. For the purpose of tracing, each wave is assigned the attributes of magnitude wave.m, the distance wave.d its predecessors have traveled from the point source, the index of the dielectric interface wave.i the wave originated from, and the direction wave.dir the wave travels in. The source point z' and observation point z are placed at the dielectric interfaces with indexes $i_{src}$ and $i_{obs}$, respectively. If in the original layered media the source and observation points are not situated at the interfaces the dielectric layers containing them are to be split into two layers with the same material properties.

To schedule evaluation of the wave scattering events the priority queue data structure is utilized. As used herein, the priority queue is a data structure for maintaining a set of elements Q, where each element is associated with a key. It supports the following three operations: (i) Q.push(x) inserts the element x into set Q, (ii) Q.top( ) returns element with the largest key, and (iii) Q.pop( ) removes the element with the largest key.

The elements in the queue are the waves for which the interactions with the nearest interfaces are to be evaluated. As the key we use 1/wave.d, wave.d being the distance the wave's predecessors have traveled prior to its insertion in the queue. The choice of the key (priority in which waves are evaluated) is stipulated by the Sommerfeld identities $$\frac{e^{-jk\sqrt{\rho^2+d^2}}}{\sqrt{\rho^2+d^2}} = \int_0^\infty \frac{e^{-j\sqrt{k^2-k_\rho^2}d}}{j\sqrt{k^2-k_\rho^2}} J_0(k_\rho\rho)k_\rho dk_\rho, \quad (A17)$$

$$\frac{1}{\rho}\left[e^{-jkd} - d\frac{e^{-jk\sqrt{\rho^2+d^2}}}{\sqrt{\rho^2+d^2}}\right] = \int_0^\infty e^{-j\sqrt{k^2-k_\rho^2}d} J_1(k_\rho\rho)k_\rho dk_\rho, \quad (A18)$$

utilized for the extraction of quasi-static contributions into the symmetric ($\tilde{K}_{xx}^A, \tilde{K}_{zz}^A, \tilde{G}^\Phi$) and non-symmetric ($\tilde{K}_{xz}^A, \tilde{K}_{yz}^A, \tilde{K}_{zx}^A, \tilde{K}_{zy}^A$) dyadic components, respectively. In both cases, a wave with magnitude m and traveled distance d contributes to the spectrum at large $k_\rho$ as $me^{-k_\rho d}$. Hence, to achieve the fastest convergence of the spectrum using image extraction the images with smallest distance d are to be extracted first.

As shown in FIG. 12, the algorithm starts from the assignment of the attributes to the initial waves traveling upwards and downwards from the point source (lines 1-4 and 6-7) followed by their insertion into the queue (lines 5 and 8). In case the source and observation points reside at the same interface the primary field contribution is immediately collected as an image (lines 10 through 13). Subsequently, the waves are simulated in order of their occurrence. The algorithm uses top( ) function at each step to choose the next wave for which the scattering event at the nearest dielectric interface is to be evaluated (line 15). The pop( ) function is then invoked in order to erase the wave from the queue and, thus, eliminate it from further consideration. Each new wave Inc has the origin at some interface i. As it scatters at a dielectric interface i±1 it gives birth to the reflected wave Ref and transmitted wave Tr, the ± sign depending on the Inc wave propagation direction (see lines 16 through 22). The interface i±1 then becomes the interface of origin for the transmitted and reflected waves (lines 23 and 26). As the reflected and transmitted waves are produced (lines 15-26), they are inserted in the priority queue (line 27). When an incident wave under consideration scatters at the interface where the observation point is situated (lines 28-30), it produces an nth image with magnitude $A_{s,n}^P$ equal to the magnitude of the transmitted wave and exponential factor $e^{-jk_z a_n}$ defined by the distance an the transmitted wave has traveled prior to arriving at the observation interface (see line 29). As the while loop indicates (lines 14 and 31), the image tracing process continues until a certain number of extracted images is reached after which no further convergence improvement is observed. The stagnation in convergence speed can be determined by monitoring the spectrum truncation point $T_0$ as a function of number of extracted images $N_\nu^P$.

4. Additional Embodiments

Additional embodiments relate to an apparatus for carrying out any one of the above-described methods, where the apparatus may include a computer for executing computer instructions related to the method. In this context the computer may be a general-purpose computer including, for example, a processor, memory, storage, and input/output devices (e.g., monitor, keyboard, disk drive, Internet connection, etc.). However, the computer may include circuitry or other specialized hardware for carrying out some or all aspects of the method. In some operational settings, the apparatus may be configured as a system that includes one or more units, each of which is configured to carry out some aspects of the method either in software, in hardware or in some combination thereof.

Additional embodiments also relate to a computer-readable medium that stores (e.g., tangibly embodies) a computer program for carrying out any one of the above-described methods by means of a computer. The computer program may be written, for example, in a general-purpose programming language (e.g., C, C++) or some specialized application-specific language. The computer program may be stored as an encoded file in some useful format (e.g., binary, ASCII).

At least some values based on the results of any one of the above-described methods can be saved, either in memory (e.g., RAM (Random Access Memory)) or permanent storage (e.g., a hard-disk system) for later use (e.g., display or further processing).

Although only certain exemplary embodiments of this invention have been described in detail above, those skilled in the art will readily appreciate that many modifications are possible in the exemplary embodiments without materially departing from the novel teachings and advantages of this invention. For example, aspects of embodiments disclosed above can be combined in other combinations to form additional embodiments. Accordingly, all such modifications are intended to be included within the scope of this invention.

5. References

The following references are related to the disclosed subject matter:

[1] F. Ling, V. Okhmatovski, W. Harris, S. McCracken, and A. Dengi, "Largescale broadband parasitic extraction for fast layout verification of 3D RF and mixed-signal on-chip structures," *IEEE Trans. Microwave Theory Tech.*, pp. 264-273, January 2005.

[2] Y. L. Chow, J. J. Yang, D. G. Fang, and G. E. Howard, "A closed-form spatial Green's function for the thick microstrip substrate," *IEEE Trans. Microwave Theory Tech.*, vol. 39, pp. 588-592, March 1991.

[3] J. S. Zhao, W. W.-M. Dai, S. Kapur, and D. E. Long, "Efficient three-dimensional extraction based on static and full-wave layer Green's functions," *Proceedings of the 35th Design Automation Conference*, June 1998.

[4] W. Cai and T. Yu, "Fast calculations of dyadic Green's functions for electromagnetic scattering in a multilayered medium," *J Comput. Phys., pp.* 1-21, 2000.

[5] M. I. Aksun, "A robust approach for the derivation of closed-form Green's functions," *IEEE Trans. Microwave Theory Tech.*, vol. 44, pp. 651-658, May 1996.

[6] F. Ling and J. M. Jin, "Discrete complex image method for general multilayer media," *IEEE Microwave Guided Wave Lett.*, vol. 10, pp. 400-402, October 2003.

[7] K. A. Michalski and J. R. Mosig, "Multilayer media Green's functions in integral equation formulations," *IEEE Trans. Antennas Propagat.*, vol. 45, no. 3, pp. 508-519, March 1997.

[8] K. A. Michalski and D. Zheng, "Electromagnetic Scattering and Radiation by Surfaces of Arbitrary Shape in Layered Media, Part I: Theory," *IEEE Trans. Antennas Propagat.*, vol. 38, no. 3, pp. 335-344, March 1990.

[9] Y. Hua, and T. K. Sarkar, "Generalized Pencil-of-Function Method for Extracting Poles of an EM System from its Transient Response," *IEEE Trans. Antennas Propagat.*, vol. 37, no. 2, pp. 229-234, February 1989.

What is claimed is:

1. A method of modeling an integrated circuit, comprising:
specifying a layout for the integrated circuit, wherein the layout includes a plurality of devices arranged in a plurality of layers and a plurality of connections between the layers;
specifying locations for a source point and an observation point for the integrated circuit;
determining a plurality of static images for the source point and the observation point;
determining a plurality of discrete complex images for the source point and the observation point;
using a computer for determining a Green's-function value for the source point and the observation point by combining the static images and the discrete complex images; and
saving at least some values based on the Green's-function value.

2. The method of claim 1, wherein specifying the layout includes specifying geometrical and electromagnetic parameters for at least some of the devices.

3. The method of claim 1, wherein
the devices are embedded in dielectric material included in the layers and include interconnects for making electrical connections between devices, and
the connections between the layers include vias for making electrical connections between the layers.

4. The method of claim 1, wherein
the devices include interconnects for making electrical connections between devices, and
the source point corresponds to one of the interconnects and the observation point corresponds to another of the interconnects.

5. The method of claim 1, wherein
the source point corresponds to a circuit input and the observation point corresponds to a circuit output, and
the circuit input and the circuit output each include a voltage value or a current value from a transmission line model for the integrated circuit.

6. The method of claim 1, wherein determining the static images includes determining magnitudes and distances for the static images in correspondence to the source point and the observation point.

7. The method of claim 1, wherein
determining the static images includes tracing a plurality of waves between the source point and the observation point, and
at least some waves determine magnitudes and distances for the static images.

8. The method of claim 1, wherein determining the discrete complex images includes:
determining a truncation value for integrating a shifted Green's function that corresponds to a subtraction of the static images from the Green's function; and
sampling the shifted Green's function on a path that is truncated by the truncation value to determine values for the discrete complex images.

9. The method of claim 8, wherein determining the values for the discrete complex images includes:
representing the shifted Green's function as a generalized pencil of functions to determine coefficients and exponents for the discrete complex images.

10. The method of claim 1, wherein determining the Green's-function value includes:
adding a contribution from the shifted Green's function to a contribution from the static images.

11. The method of claim 1, wherein saving at least some values based on the Green's-function value includes storing the Green's-function value in a matrix that includes related Green's-function values for relating voltage values and current values in the integrated circuit.

12. The method of claim 1, wherein the static images characterize a static portion of the Green's function for small frequencies of a spectral kernel for the Green's function.

13. The method of claim 1, wherein determining the static images includes:
    tracing a plurality of waves between the source point and the observation point, wherein tracing the waves includes prioritizing the waves for tracing according to corresponding distances between the source point and the observation point so that waves with smaller distances have higher priorities, and
    calculating the static images from magnitudes and distances of the waves.

14. The method of claim 1, wherein determining the static images includes:
    tracing a plurality of waves between the source point and the observation point by splitting waves into reflected and transmitted waves at one or more interfaces of the layers, wherein the source point and the observation point are in different layers of the integrated circuit, and
    calculating the static images from magnitudes and distances of the waves.

15. The method of claim 1, wherein
    determining the static images includes: tracing a plurality of waves between the source point and the observation point by splitting waves into reflected and transmitted waves at one or more interfaces of the layers, wherein the source point and the observation point are in different layers of the integrated circuit, and calculating the static images from magnitudes and distances of the waves,
    determining the discrete complex images includes: determining a truncation value for integrating a shifted Green's function that corresponds to a subtraction of the static images from the Green's function, and sampling the shifted Green's function on a path based on the truncation value to determine values for the discrete complex images; and
    determining the Green's-function value includes: adding a contribution from the shifted Green's function to a contribution from the static images.

16. A computer-readable medium that stores a computer program that causes a computer to execute instructions for modeling an integrated circuit, wherein the computer program includes instructions for:
    specifying a layout for the integrated circuit, wherein the layout includes a plurality of devices arranged in a plurality of layers and a plurality of connections between the layers;
    specifying locations for a source point and an observation point for the integrated circuit;
    determining a plurality of static images for the source point and the observation point;
    determining a plurality of discrete complex images for the source point and the observation point;
    determining a Green's-function value for the source point and the observation point by combining the static images and the discrete complex images; and
    saving at least some values based on the Green's-function value.

17. The computer-readable medium of claim 16, wherein specifying the layout includes specifying geometrical and electromagnetic parameters for at least some of the devices.

18. The computer-readable medium of claim 16, wherein the devices are embedded in dielectric material included in the layers and include interconnects for making electrical connections between devices, and
    the connections between the layers include vias for making electrical connections between the layers.

19. The computer-readable medium of claim 16, wherein the devices include interconnects for making electrical connections between devices, and
    the source point corresponds to one of the interconnects and the observation point corresponds to another of the interconnects.

20. The computer-readable medium of claim 16, wherein the source point corresponds to a circuit input and the observation point corresponds to a circuit output, and
    the circuit input and the circuit output each include a voltage value or a current value from a transmission line model for the integrated circuit.

21. The computer-readable medium of claim 16, wherein determining the static images includes determining magnitudes and distances for the static images in correspondence to the source point and the observation point.

22. The computer-readable medium of claim 16, wherein
    determining the static images includes tracing a plurality of waves between the source point and the observation point, and
    at least some waves determine magnitudes and distances for the static images.

23. The computer-readable medium of claim 16, wherein determining the discrete complex images includes:
    determining a truncation value for integrating a shifted Green's function that corresponds to a subtraction of the static images from the Green's function; and
    sampling the shifted Green's function on a path that is truncated by the truncation value to determine values for the discrete complex images.

24. The computer-readable medium of claim 23, wherein determining the values for the discrete complex images includes:
    representing the shifted Green's function as a generalized pencil of functions to determine coefficients and exponents for the discrete complex images.

25. The computer-readable medium of claim 16, wherein determining the Green's-function value includes:
    adding a contribution from the shifted Green's function to a contribution from the static images.

26. The computer-readable medium of claim 16, wherein saving at least some values based on the Green's-function value includes storing the Green's-function value in a matrix that includes related Green's-function values for relating voltage values and current values in the integrated circuit.

27. An apparatus for modeling an integrated circuit, the apparatus comprising a computer for executing computer instructions, wherein the computer includes computer instructions for:
    specifying a layout for the integrated circuit, wherein the layout includes a plurality of devices arranged in a plurality of layers and a plurality of connections between the layers;
    specifying locations for a source point and an observation point for the integrated circuit;
    determining a plurality of static images for the source point and the observation point;
    determining a plurality of discrete complex images for the source point and the observation point;
    determining a Green's-function value for the source point and the observation point by combining the static images and the discrete complex images; and saving at least some values based on the Green's-function value.

28. The apparatus of claim 27, wherein the computer includes a processor with memory for executing at least some of the computer instructions.

29. The apparatus of claim 27, wherein the computer includes circuitry for executing at least some of the computer instructions.

\* \* \* \* \*